(12) United States Patent
Kim et al.

(10) Patent No.: US 7,018,903 B2
(45) Date of Patent: Mar. 28, 2006

(54) METHOD OF FORMING SEMICONDUCTOR DEVICE WITH CAPACITOR

(75) Inventors: Hong-Ki Kim, Suwon-shi (KR);
Jae-Hee Oh, Kyunggi-do (KR);
Kwan-Young Youn, Bucheon-shi (KR)

(73) Assignee: Samsung Electronics Co., Ltd., Suwon-City (KR)

( * ) Notice: Subject to any disclaimer, the term of this patent is extended or adjusted under 35 U.S.C. 154(b) by 92 days.

(21) Appl. No.: 10/676,336

(22) Filed: Oct. 1, 2003

(65) Prior Publication Data
US 2004/0132246 A1    Jul. 8, 2004

(30) Foreign Application Priority Data
Oct. 2, 2002    (KR)    ............... 10-2002-0060248

(51) Int. Cl.
*H01L 21/20*  (2006.01)
*H01L 21/302* (2006.01)
*H01L 21/461* (2006.01)

(52) U.S. Cl. ............... 438/386; 438/399; 438/738

(58) Field of Classification Search ......... 438/123, 438/901, 399, 738, 386, 271; 361/271
See application file for complete search history.

(56) References Cited

U.S. PATENT DOCUMENTS

| | | | | |
|---|---|---|---|---|
| 5,310,626 A | * | 5/1994 | Fernandes et al. | 430/327 |
| 5,504,026 A | * | 4/1996 | Kung | 438/50 |
| 6,500,763 B1 | * | 12/2002 | Kim et al. | 438/689 |
| 6,624,018 B1 | * | 9/2003 | Yu et al. | 438/239 |
| 6,653,186 B1 | * | 11/2003 | Won et al. | 438/253 |
| 2003/0032238 A1 | * | 2/2003 | Kim et al. | |
| 2004/0009662 A1 | * | 1/2004 | Park et al. | 438/640 |

OTHER PUBLICATIONS

Stanley Wolf and Richard N. Tauber, Silicon Processing for the VLSI Era, vol. 1, Second edition, Lattice Press, 2000, p. 193.*

* cited by examiner

*Primary Examiner*—Carl Whitehead, Jr.
*Assistant Examiner*—Heather Doty
(74) *Attorney, Agent, or Firm*—F. Chau & Associates, LLC

(57) ABSTRACT

A method of forming a semiconductor device comprising: sequentially forming a supporting layer and a sacrificial layer over a semiconductor substrate; forming an opening by patterning the sacrificial layer and the supporting layer; forming a bottom electrode covering the inner wall and the bottom of the opening; removing the sacrificial layer by a wet etch process; and forming a dielectric layer and an upper electrode on the bottom electrode and the supporting layer, wherein the sacrificial layer is formed of a material having a faster wet etch rate than the supporting layer.

10 Claims, 6 Drawing Sheets

METHOD OF FORMING SEMICONDUCTOR DEVICE WITH CAPACITOR

BACKGROUND OF THE INVENTION

1. Field of the Invention

The present invention relates to a method of forming a semiconductor device, and more particularly, to a method of forming a semiconductor device including a capacitor.

2. Discussion of Related Art

As semiconductor devices become more highly integrated, embodying high integration without reducing capacitance of capacitors becomes more important. Capacitance of a capacitor is in direct proportion to surface area but in inverse proportion to distance between capacitor electrodes. As semiconductor devices become more highly integrated, the distance between the capacitor electrodes become narrower. Thus, in order to keep capacitance of the capacitor constant, the surface areas thereof need to be increased. A cylinder type capacitor is an example of a capacitor having greater surface area.

FIGS. 1A through 1C are sequential views of a conventional method of forming a semiconductor device with a capacitor. In FIGS. 1A through 1C, the letter 'a' indicates a cell array region, and the letter 'b' indicates a peripheral circuit region.

Referring to FIG. 1A, a bottom dielectric layer 10 is formed on an entire surface of a semiconductor substrate 1. The bottom dielectric layer 10 is patterned to form bottom contact holes 9a and 9b. A bottom conductive layer (not shown) is formed to fill the contact holes 9a and 9b. The bottom conductive layer is planarized to form bottom contact plugs 12a and 12b at the cell array region a and the peripheral circuit region b, respectively. A first etch stopping layer 14, a supporting layer 16, a second etch stopping layer 18 and a sacrificial layer 19 are sequentially formed on a bottom dielectric layer 10 and the bottom contact plugs 12a and 12b. The layers 19, 18, 16 and 14 are patterned by a dry etch process, thereby forming an opening 13, exposing the bottom contact plug 12a and a part of the bottom dielectric layer 10 adjacent to the bottom contact plug 12a.

Referring to FIG. 1B, a first conductive layer (not shown) is conformally formed on layers 10, 12a, 14, 16, 18, and 19. A part of the first conductive layer is removed to form a bottom electrode 20 covering the inside wall of the opening 1. The sacrificial layer 19 is removed by a wet etch process, thereby exposing an upper part of the outside wall of the bottom electrode 20. A dielectric layer 22 and a second conductive layer 24 are sequentially formed on layer 18 and a bottom electrode 20. The dielectric layer 22 and the second conductive layer 24 are patterned to form a dielectric pattern 22 and an upper electrode 24 that cover the bottom electrode 20 and the second etch stopping layer 18 at the cell array region a. Thus, a capacitor structure is completed. The second etch stopping layer 18 is exposed at the peripheral circuit region b.

Referring to FIG. 1C, a dielectric layer 26 is formed on layers 18 and 24, thereby covering the capacitor. At the peripheral circuit region b, the dielectric layer 26, the second etch stopping layer 18, the supporting layer 16 and the first etch stopping layer 14 are sequentially patterned by using a dry etch process, thereby forming an upper contact hole 29. The upper contact hole 29 is filled with a conductive layer (not shown) to form an upper contact plug 28 contacting with the bottom contact plug 12b. At the cell array region a, the dielectric layer 26 is patterned to form an upper electrode contact hole 31. The upper electrode contact hole 31 is filled with a conductive layer (not shown) to form an upper electrode contact plug 30 contacting with the upper electrode 24.

The ratio of etch rate of different materials is known as the selectivity of an etched process. In the conventional method, the sacrificial layer 19 and the supporting layer 16 are composed of oxide layers that have no wet etch selectivity ratio with respect to each other. Thus, in order to prevent the supporting layer 16 from being removed when the wet etch process is performed to form the bottom electrode 20, the second etch stopping layer 18 of silicon nitride is used. Thus, in conventional technology, the second etch stopping layer 18 is additionally deposited, and the layer 18 needs to be partially removed when an upper contact plug 28 is formed in a subsequent process. This adds to the complexity of the process, causes poor step coverage and bad profile of the upper contact hole 29 since the characteristics of layers (16, 18, and 26) are different from each other.

A need therefore exists for performing wet etch process without using a second etch stopping layer.

SUMMARY OF THE INVENTION

According to one embodiment of the present invention, a method of forming a semiconductor device comprising: sequentially forming a supporting layer and a sacrificial layer over a semiconductor substrate; forming an opening by patterning the sacrificial layer and the supporting layer; forming a bottom electrode covering the inner wall and the bottom of the opening; removing the sacrificial layer by a wet etch process; and forming a dielectric layer and an upper electrode on the bottom electrode and the supporting layer, wherein the sacrificial layer is formed of a material having a faster wet etch rate than the supporting layer.

According to another embodiment of the present invention, a method of forming a semiconductor device comprising: sequentially forming a supporting layer and a sacrificial layer over a semiconductor substrate; forming an opening by patterning the sacrificial layer and the supporting layer; and removing the sacrificial layer by a wet etch process wherein the sacrificial layer is formed of a material that has a faster wet etch rate than the supporting layer.

Preferably, the supporting layer is formed of a plasma-enhanced tetraethyl orthosilicate (PETEOS) oxide or a high-density plasma (HDP) oxide.

Preferably, the sacrificial layer is formed of one material selected from a group consisting of a hydrogen silsesquioxane (HSQ) oxide, a borophoshphosilicate glass (BPSG) oxide and a phosphosilicate (PSG) oxide.

Thus, the present invention provides for a method of forming a semiconductor device including a capacitor. This invention reduces complexity of a process and improves a profile of a contact hole. This is achieved by removing a second etch stopping layer.

DETAILED DESCRIPTION OF PREFERRED EMBODIMENTS

Figure 1A:
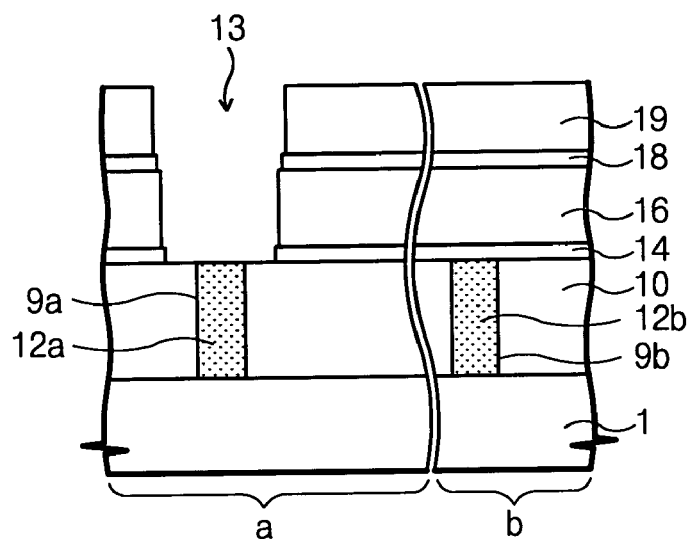
FIGS. 1A through 1C illustrate a conventional method of forming a semiconductor device with a capacitor.
Figure 1B:
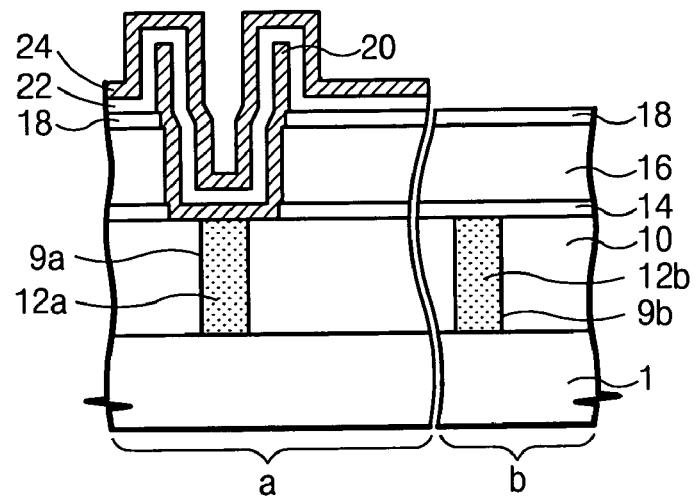
Figure 1C:
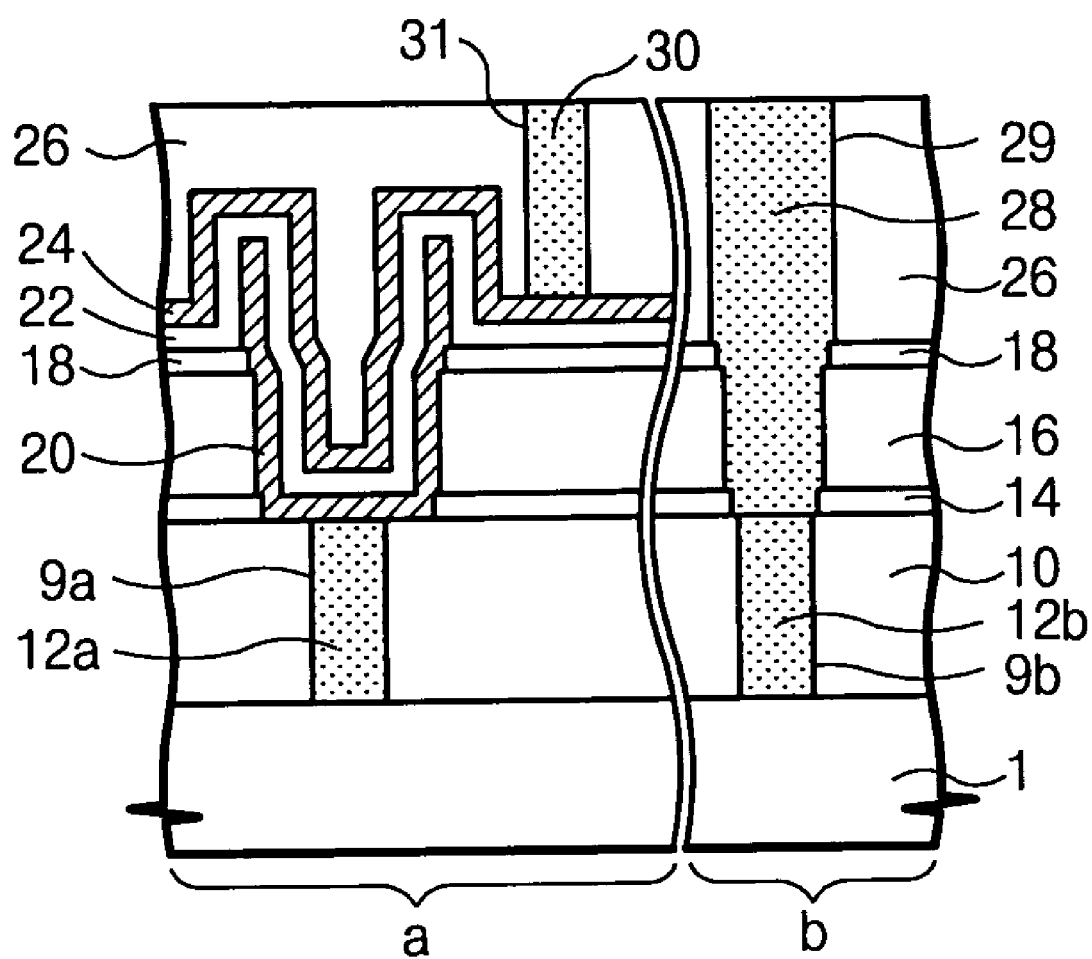

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be "directly on" the other element or intervening elements may also be present.

Furthermore, relative terms, such as "beneath", may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as "below" other elements would then be oriented "above" the other elements. The exemplary term "below", can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section. Like numbers refer to like elements throughout. In FIGS. 2A–2G, the letter 'a' indicates a cell array region the letter 'b' indicates a peripheral circuit region.

FIGS. 2A through 2G illustrate cross-sectional views of a method of forming a semiconductor device with a capacitor according to a preferred embodiment of the present invention.

Figure 2A:
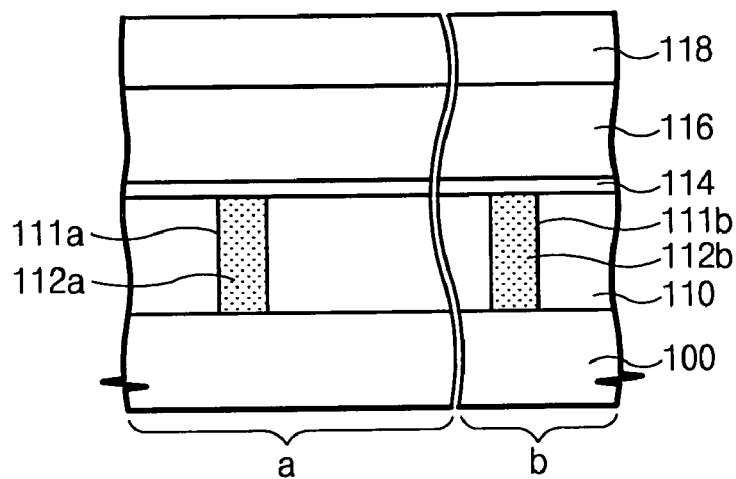
FIGS. 2A through 2G illustrate cross-sectional views of a method of forming a semiconductor device with a capacitor according to a preferred embodiment of the present invention.

Referring to FIG. 2A, a bottom dielectric layer 110 is formed on an entire surface of a semiconductor substrate 100. The dielectric layer 110 is preferably an interlayer type layer and formed of oxide. The bottom dielectric layer 110 is patterned to form bottom contact holes 111a and 111b. The bottom contact holes are filled with a bottom conductive layer (not shown) to form bottom contact plugs 112a and 112b, contacting with the semiconductor substrate 100 at the cell array region a and the peripheral circuit region b, respectively. An etch stopping layer 114, a supporting layer 116 and a sacrificial layer 118 are sequentially formed on bottom dielectric layer 110 and the bottom contact plugs 112a and 112b. Preferably, the supporting layer 116 and the sacrificial layer 118 are formed of materials of oxide and the sacrificial layer 118 has a faster wet etch rate than the supporting layer 116. The etch rate is a rate at which material is removed from the film by etching. The rate depends strongly on the film composition. For example, $Si_3N_4$ etch rate is about 100 Å/min. Preferably, the supporting layer 116 is formed of a plasma-enhanced tetraethyl orthosilicate (PETEOS) oxide or a high density plasma (HDP) oxide. The sacrificial layer 118 is formed of one material selected from a group consisting of a hydrogen silsesquioxane (HSQ) oxide, a borophosphosilicate (BPSG) oxide and a phosphosilicate glass (PSG) oxide.

Figure 2B:
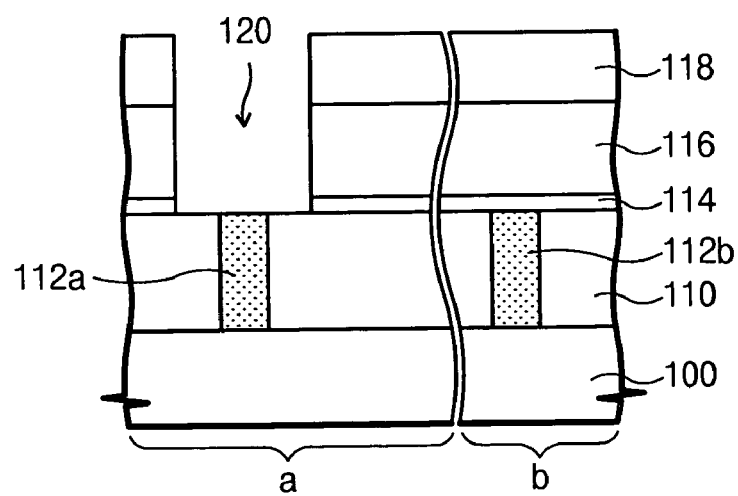

When the etching can proceed in all directions at the same rate, it is said to be isotropic. If etching proceeds exclusively in one direction (e.g. only vertically), the etching process is to be completely anisotropic. Referring to FIG. 2B, the sacrificial layer 118, the supporting layer 116 and the etch stopping layer 114 are sequentially anisotropically etched to form an opening 120, partially exposing the bottom contact plug 112a and the neighboring bottom dielectric layer 110. Preferably, the opening 120 has a cylinder shape.

Figure 2C:
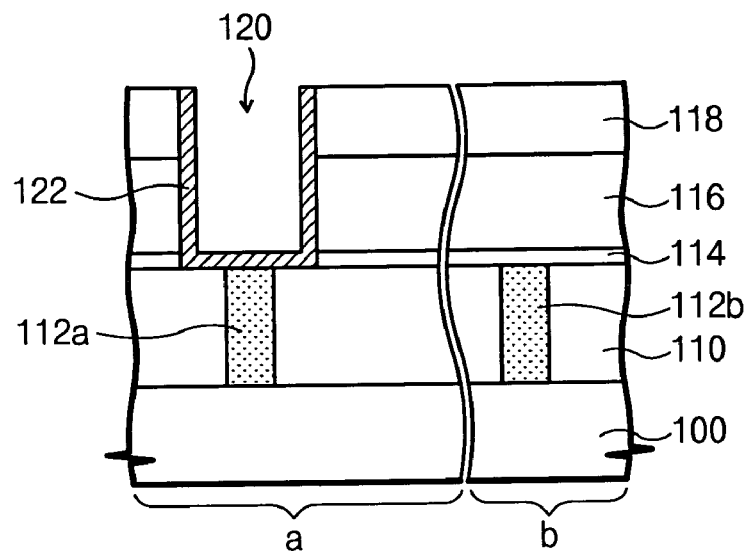

Referring to FIG. 2C, a first conductive layer (not shown) is conformally formed on the surface of the opening 120. The first conductive layer may be formed of titanium nitride, ruthenium or tungsten. A sacrificial oxide layer (not shown) is formed on the first conductive layer to fill the opening 120. The sacrificial oxide layer filling the opening 120 may be formed of the same material as the sacrificial layer 118. A top part of the first conductive layer is removed by a dry etch process or a CMP process, thereby exposing the sacrificial layer 118 and simultaneously forming a bottom electrode 122 covering the inner wall and the bottom of the opening 120. The sacrificial layer filling the opening 120 is removed.

Figure 2D:
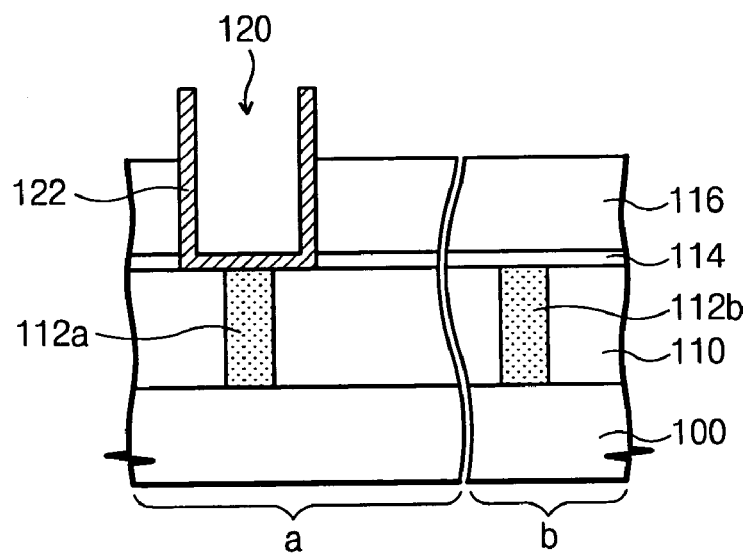

Referring to FIG. 2D, the sacrificial layer 118 is removed by a wet etch process to expose an outer upper part of the bottom electrode 122 and the supporting layer 116. The supporting layer 116 prevents the bottom electrode 122 from falling over. When the sacrificial oxide layer filling the opening 120 is formed of the same material with the sacrificial layer 118, the sacrificial oxide layer and the sacrificial layer 118 are simultaneously removed. The wet etch process may be performed by using a hydrofluoric acid (HF) solution, which dissolves the oxide away.

Figure 2E:
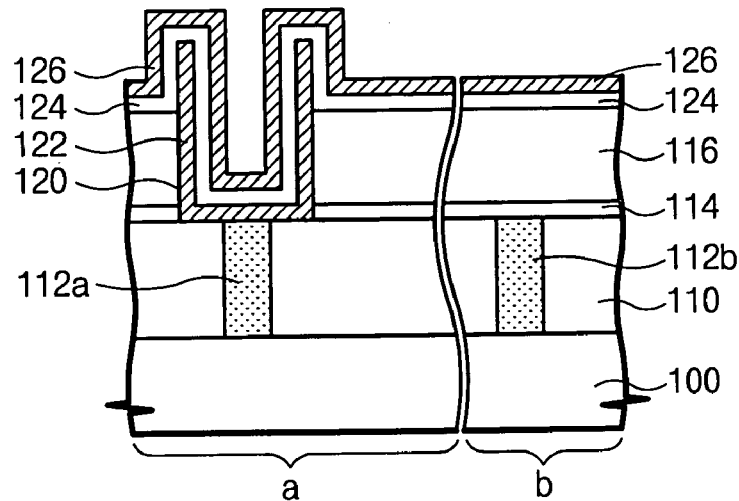
Figure 2F:
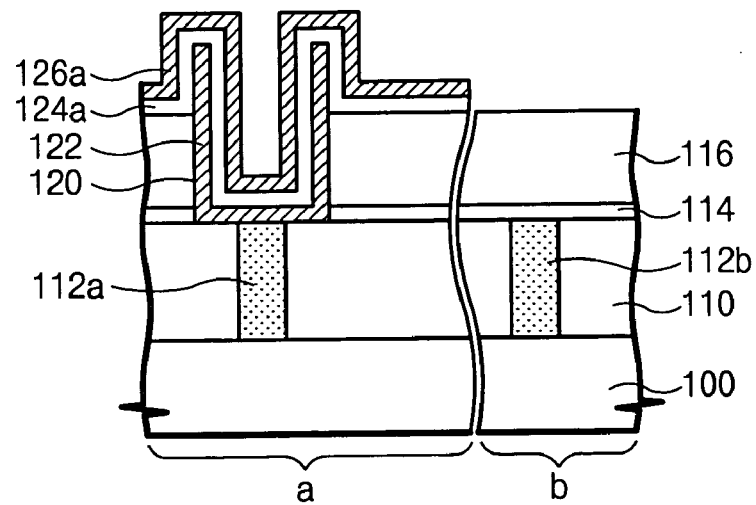

Referring to FIGS. 2E and 2F, a dielectric layer 124 and a second conductive layer 126 are conformally sequentially formed on layers 116 and 122. The dielectric layer 124 may be formed of tantalum oxide, aluminum oxide or hafnium oxide. The second conductive layer 126 may be formed of titanium nitride, ruthenium or tungsten like the first conductive layer 122. The second conductive layer 126 and the dielectric layer 124 are removed at the peripheral circuit region b, thereby forming a dielectric pattern 124a and an upper electrode 126a covering the supporting layer 116 and the inner wall, the bottom and the outer upper part of the bottom electrode 122 at the cell array region a. The upper electrode 126a, the dielectric pattern 124a and the bottom electrode 122 compose a capacitor of an inner cylinder type.

Figure 2G:
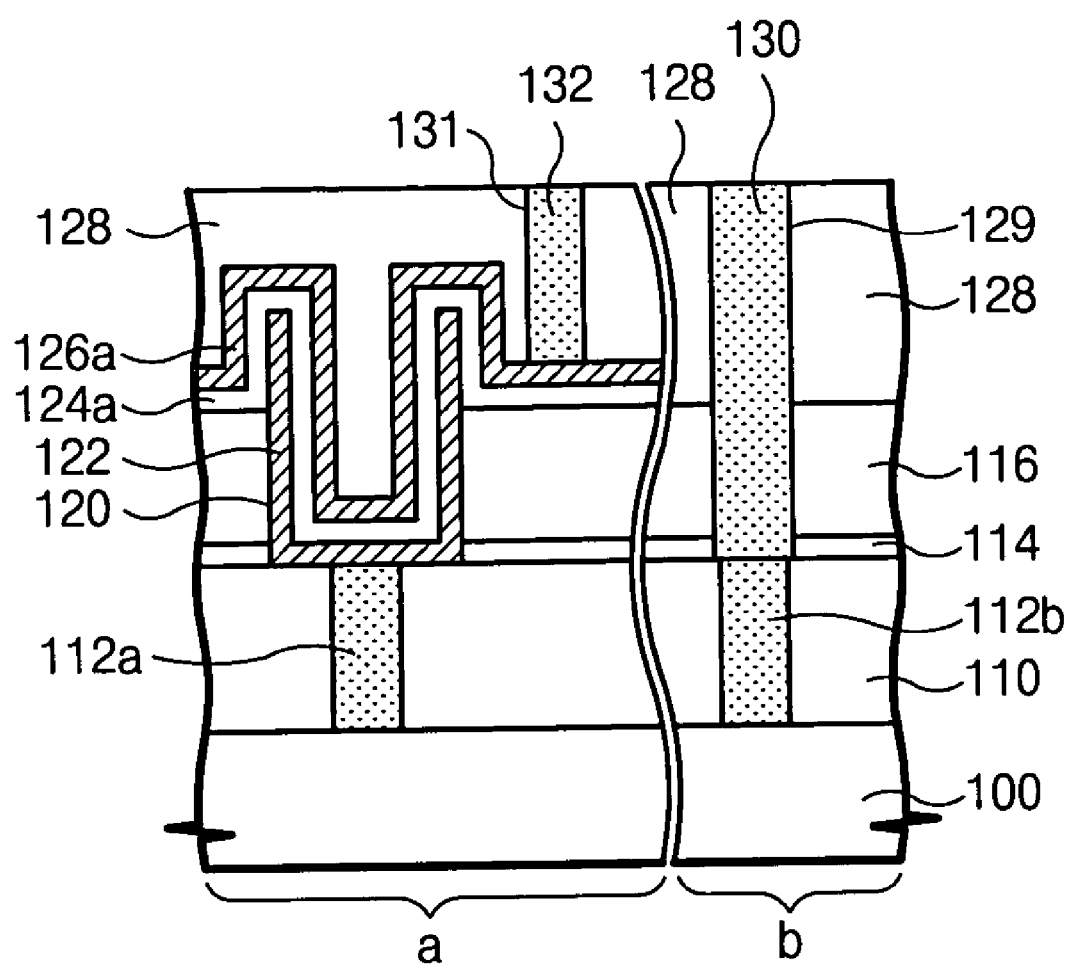

Referring to FIG. 2G, a dielectric layer 128 is formed on the upper electrode 126a and the supporting layer 116. The dielectric layer 128 may be formed of a material of oxides such as titanium oxide, aluminum oxide, or hafnium oxide. The interlayer dielectric layer 128, the supporting layer 116 and the etch stopping layer 114 are sequentially patterned to form an upper contact hole 129 at the peripheral circuit region b. The upper contact hole 129 is filled with a conductive material (not shown) to from an upper contact plug 130 that electrically connects with the bottom contact plug 112b. At the same time, the dielectric layer 128 is patterned to form an upper electrode contact hole 131 at the cell array region a. The upper electrode contact hole 131 is filled with a conductive material (not shown) to form an upper electrode contact plug 132 that electrically connects with the upper electrode 126a.

Accordingly, the method of forming a semiconductor substrate including a capacitor employs a sacrificial layer and a supporting layer that have different wet etch rates. The process according to this embodiment eliminates the need for an additional etch stopping layer between the sacrificial layer and the supporting layer. This results in a simplified process and a smooth profile of a metal contact plug.

While the present invention has been described in detail with reference to the preferred embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a semiconductor device comprising:
   sequentially forming a supporting layer and a sacrificial layer over a semiconductor substrate;
   forming an opening by patterning the sacrificial layer and the supporting layer;
   forming a bottom electrode covering the inner wall and the bottom of the opening;
   removing the sacrificial layer by a wet etch process; and
   forming a dielectric layer and an upper electrode on the bottom electrode and the supporting layer,
   wherein the sacrificial layer is formed of a material having a faster wet etch rate than the supporting layer, and the supporting layer comprises a single layer.

2. The method as claimed in claim 1, further comprising forming a bottom contact plug on the semiconductor substrate before forming the supporting layer, wherein the opening exposes the bottom contact plug and the opening has a wider width than the bottom contact plug.

3. The method as claimed in claim 1, wherein the supporting layer is formed of a plasma-enhanced tetraethyl orthosilicate (PETEOS) oxide or a high-density plasma (HDP) oxide.

4. The method as claimed in claim 1, wherein the sacrificial layer is formed of one material selected from a group consisting of a hydrogen silsesquioxane (HSQ) oxide, a borophosphosilicate glass (BPSG) oxide and a phosphosilicate (PSG) oxide.

5. The method as claimed in claim 1, wherein the wet etch process is performed by using a HF solution.

6. The method as claimed in claim 1, further comprising:
   forming an insulating layer over an entire surface of the semiconductor substrate comprising the upper electrode;
   patterning the insulating layer to form a contact hole; and
   filling the contact hole with a conductive material to form a contact plug.

7. A method of forming a semiconductor device comprising:
   sequentially forming a supporting layer and a sacrificial layer over a semiconductor substrate;
   forming an opening by patterning the sacrificial layer and the supporting layer;
   removing the sacrificial layer by a wet etch process, wherein the sacrificial layer is formed of a material that has a faster wet etch rate than the supporting layer, and the supporting layer comprises a single layer;
   forming a dielectric layer over the supporting layer;
   patterning the dielectric layer and the supporting layer to form a contact hole; and
   filling the contact hole with a conductive material to form a contact plug.

8. The method as claimed in claim 7, wherein the supporting layer includes a plasma-enhanced tetraethyl orthosilicate (PETEOS) oxide or a high-density plasma (HDP) oxide.

9. The method as claimed in claim 7, wherein the sacrificial layer includes a hydrogen silsesquioxane (HSQ) oxide, a borophosphosilicate glass (BPSG) oxide or a phosphosilicate (PSG) oxide.

10. The method as claimed in claim 7, wherein the wet etch process is performed by using a HF solution.

* * * * *